United States Patent [19]

Unger

[11] Patent Number: 4,546,329

[45] Date of Patent: Oct. 8, 1985

[54] FREQUENCY SYNTHESIZERS ADAPTIVE LOOP FILTER WITH COMPENSATION FOR TRANSIENTS

[75] Inventor: John D. Unger, Barrington, Ill.

[73] Assignee: Motorola, Inc., Schaumburg, Ill.

[21] Appl. No.: 424,816

[22] Filed: Sep. 27, 1982

[51] Int. Cl.[4] .......... H03L 7/06

[52] U.S. Cl. .......... 331/16; 331/17; 331/25; 331/DIG. 2

[58] Field of Search .......... 331/16, 17, 25, DIG. 2; 307/571, 574; 328/133, 134, 155

[56] References Cited

U.S. PATENT DOCUMENTS 4,007,429 2/1977 Cadalora et al. .......... 331/DIG. 2 X
4,135,165 1/1979 Coe .......... 331/16 X
4,167,711 9/1979 Smoot .......... 331/25 X

*Primary Examiner*—Eugene R. LaRoche
*Assistant Examiner*—D. C. Mis
*Attorney, Agent, or Firm*—Rolland R. Hackbart; Edward M. Roney; James W. Gillman

[57] ABSTRACT

An improved adaptive loop filter for modulatable frequency synthesizers containing digital phase comparators is described. The unique adaptive loop filter provides a wide bandwidth during a signal acquisition mode and a narrow bandwidth during a signal tracking mode. The adaptive loop filter includes a current limiter coupled to the error signal from the digital phase comparator for generating a current-limited output signal; a filter coupled by a resistor to the current limiter output signal and including a series-coupled resistor and capacitor for filtering the current limiter output signal to provide a steering line voltage; an amplifier coupled to the junction between the filter resistor and capacitor for generating a feedback signal; a resistor for coupling the feedback signal to the current limiter output signal for substantially reducing the duration of voltage transients; and a reference filter for coupling the steering line voltage to the steering input of a voltage-controlled oscillator. The wide acquisition loop bandwidth and the narrow tracking loop bandwidth are provided by switchably coupling different resistors to the filter capacitor. The phase shift produced by the reference filter is also changed depending on whether the acquisition or steering mode is active.

12 Claims, 1 Drawing Figure

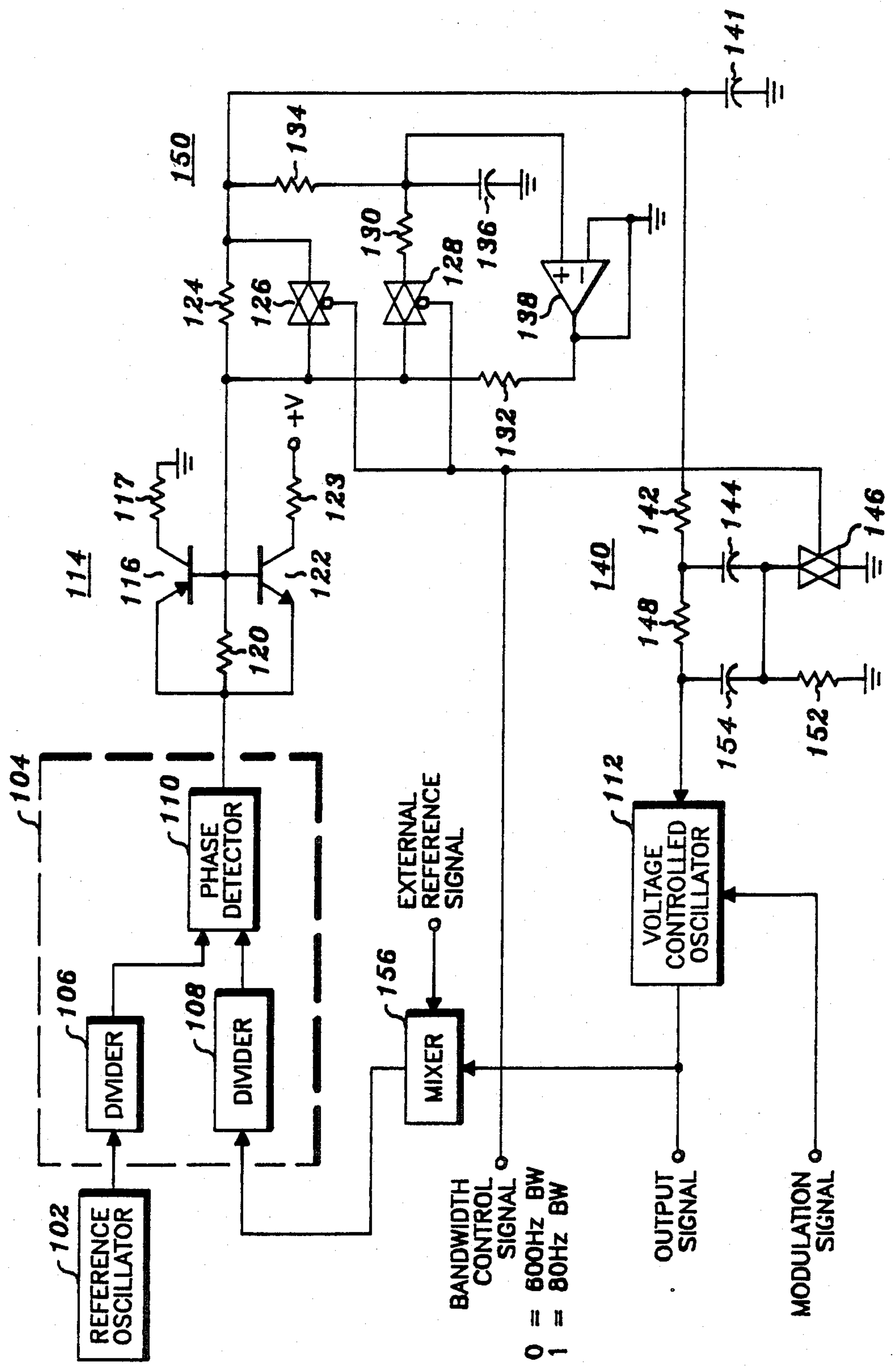
REFERENCE OSCILLATOR
102
104
DIVIDER
106
DIVIDER
108
PHASE DETECTOR
110
MIXER
156
EXTERNAL REFERENCE SIGNAL
VOLTAGE CONTROLLED OSCILLATOR
112
BANDWIDTH CONTROL SIGNAL
0 = 600Hz BW
1 = 80Hz BW
OUTPUT SIGNAL
MODULATION SIGNAL
114
116
117
120
122
123
+V
124
126
128
130
132
134
136
138
140
141
142
144
146
148
150
152
154

FREQUENCY SYNTHESIZERS ADAPTIVE LOOP FILTER WITH COMPENSATION FOR TRANSIENTS

BACKGROUND OF THE INVENTION

The present invention relates generally to frequency synthesizers, and more particularly to an improved dual-bandwidth loop filter for use in frequency synthesizers of the type containing digital phase comparators.

In radio frequency synthesizers, it is desirable to have fast frequency locking characteristics when switching to a desired radio signal frequency, while at the same time, adequately attenuating reference signal feedthru and modulating the synthesizer output with signals having frequencies as low as 200 Hz once the synthesizer has locked onto the desired radio signal frequency. In order to provide fast frequency locking characteristics, prior art synthesizers, such as the described in U.S. Pat. No. 4,330,758, provide a wide loop bandwidth in order to lock quickly to a desired radio signal frequency and a narrower loop bandwidth once frequency lock has been obtained in order to attenuate reference signal feedthru. However, in switching from a wide to a narrow loop bandwidth, such prior art synthesizers typically introduce voltage transients which result in undesirable noise on the synthesizer output signal, the duration of which is stretched and emphasized due to the narrower loop bandwidth. Furthermore, much more costly and complex circuitry is required in the sample-and-hold phase comparator used in the synthesizer in U.S. Pat. No. 4,330,758 than in a digital phase comparator. In prior art synthesizers containing digital phase comparators, an extended modulation signal bandwidth has been obtained by modulating both the reference oscillator and the voltage-controlled oscillator. However, this scheme not only requires an expensive reference oscillator, but also results in excessive reference signal feedthru.

OBJECTS AND SUMMARY OF THE INVENTION

Accordingly, it is an object of the present invention to provide an improved adaptive loop filter for frequency synthesizers that greatly attentuates noise due to bandwidth switching and reference signal feedthru.

It is another object of the present invention to provide an improved adaptive loop filter for frequency synthesizers that locks on frequency quickly and is also modulatable at audio signal frequencies as low as 200 Hz.

Briefly described, the present invention encompasses an improved loop filter for frequency synthesizers of the type including a signal source for generating a reference signal, a phase detector coupled to the reference signal and a first feedback signal for generating an error signal, a voltage-controlled oscillator (VCO) coupled to the loop filter, and a divider coupled to the VCO for providing the first feedback signal. The improved loop filter includes a current limiter coupled to the error signal from the phase detector for generating a current-limited output signal; a first resistor coupled to the current limiter output signal; a filter coupled to the first resistor and including a series-coupled second resistor and capacitor for filtering the current limiter output signal to provide a steering signal which is coupled to the VCO; an amplifier coupled to the junction between the series-coupled second resistor and the capacitor for generating a second feedback signal; and a third resistor coupling the second feedback signal to the current limiter output signal for substantially reducing the duration of voltage transients on the current limiter output signal.

BRIEF DESCRIPTION OF THE DRAWING

A frequency synthesizer including a detailed circuit diagram of an adaptive loop filter embodying the present invention is illustrated in the drawing.

DETAILED DESCRIPTION OF THE PREFERRED EMBODIMENT

Referring to the drawing, there is illustrated a frequency synthesizer or a radio transmitter that includes an improved adaptive loop filter 114, 150 and 140 embodying the present invention. The adaptive loop filter 114, 150 and 140 is responsive to a bandwidth control signal for switching the loop bandwidth of the synthesizer between a wide bandwidth for locking the loop quickly and a narrow bandwidth once lock is obtained. In the preferred embodiment, the loop bandwidth is switched between a wide bandwidth of 600 Hz and a narrow bandwidth of 80 Hz. The narrow bandwidth has been selected to be 80 Hz so that the frequency response of the synthesizer will be relatively flat at audio signal frequencies as low as 200 Hz. As a result, the synthesizer can be modulated by a modulation signal, such as audio signals or digital data signals, having frequencies ranging from as low as 200 Hz to 3,000 Hz or higher.

In addition to loop filter 114, 150 and 140, the synthesizer includes a voltage-controlled oscillator (VCO) 112 having a steering input coupled to the output of the loop filter, a mixer 156 coupled to an external reference signal and the output signal of VCO 112, a divider 108 coupled to the output of mixer 156, a reference oscillator 102 providing a reference signal of a predetermined frequency, a reference divider 106 coupled to the reference signal, and a phase detector 110 coupled to the outputs of reference divider 106 and divider 108. In a radio transceiver, the external reference signal can be provided by another synthesizer in the receiver. In such radio transceivers, mixer 156 is used to maintain a constant offset between the frequencies of the output signals from the transmitter synthesizer and receiver synthesizer. In other applications, the VCO output signal can be connected directly to divider 108.

Reference divider 106, divider 108 and phase detector 110 can be provided by commercially available frequency synthesizer integrated circuits 104, such as the Motorola type MC145146 and MC145156 frequency synthesizer integrated circuits manufactured by Motorola Semiconductor Products, Inc., Austin, Texas. Specifications describing the operation and circuitry of the MC145146 and MC145156 frequency synthesizer are published by an available from Motorola Semiconductor Products, Inc. Separate integrated circuits are also commercially available for reference divider 106, divider 108 and phase detector 110.

The output signal provided by the synthesizer is taken from VCO 112 and may be coupled to the transmitting circuitry of a conventional radio transceiver. VCO 112 may also be coupled to a modulation signal, which may be an audio signal such as voice signals from a microphone or a digital signal such as a binary data signal. The synthesizer and transmitting circuitry are described in further detail in Motorola instruction manual no. 68P81061E10 entitled "MCR 1200 Nordic Mobile Telephone", published by and available from the Technical Writing Services Department, Motorola, Inc., 1301 East Algonquin Road, Schaumburg, Illinois.

Adaptive loop filter 114, 150 and 140 includes a current limiter 114, lag filter 150 and reference filter 140. Current limiter 114 includes transistors 116 and 122 which generate a current-limited output signal by bleeding off excess current from the error signal output of phase detector 110 to the +V supply through resistor 123 or to signal ground through resistor 117. This operation is possible since the tri-state output of phase detector 110 in MOS synthesizer integrated circuits 104 possesses inherent current limiting characteristics. A relatively small current through resistor 120 biases either transistor 116 or transistor 122 into the on state in response to a high or low pulse, respectively, from the error signal output of phase detector 110. The error signal from phase detector 110 is a high or low pulse having a repetition rate equal to the frequency of the reference signal from reference oscillator 102 divided by the pre-selected modulus of divider 106.

The synthesizer has two operational states, a 600 Hz bandwidth state or acquisition mode, and an 80 Hz bandwidth state or tracking mode. During the quiescent 80 Hz bandwidth state, the output of phase comparator 110 spends most of the time in a high impedance tri-state mode, and generates high or low pulses as required to keep the loop in phase lock during minor perturbations, such as noise generated in the internal circuitry, or voltage variations due to leakage current through capacitors in the loop filter. This is true in general of digital phase comparators having a tri-state output. These pulses result in necessary reference signal energy at the phase detector output, which is filtered and greatly attenuated by the loop filter before reaching the steering input of VCO 112. Additional unnecessary reference signal energy is generated by the residual capacitance in the phase comparator output due to the fact that the voltage at its output will usually remain near +V or ground after each pulse since most conventional phase comparators (such as those in the MC145146 and MC145156 synthesizer integrated circuits) do not switch the pull-up and the pull-down transistors in the tri-state output circuit to the tri-state mode at exactly the same time. In prior art synthesizers, the energy stored in the residual capactance of the phase detector output is discharged into a typically large value resistor 124, causing substantial unnecessary reference energy which appears as undesirable spurious energy on the VCO output signal.

According to an important feature of the present invention, the inclusion of resistor 132 and amplifier 138 discharges the residual capacitance of the phase detecter output rapidly, thus minimizing unnecessary reference signal energy and substantially eliminating reference signal feedthru. When the output of phase comparator 110 is in the tri-state mode, the residual capacitance is discharged by amplifier 138 through resistor 132 and current limiter 114. Due to the fact that the average voltage on each end of resistor 132 is the same in the quiescent state, the presence of the resistor 132 does not disturb the high impedance tri-state mode of the output of phase detector 110. This is necessary to maintain proper operation of phase detector 110.

The loop bandwidth of the synthesizer is switched between a wide bandwidth of approximately 600 Hz in the acquisition mode and a narrow bandwidth of approximately 80 Hz in the tracking mode by turning on and turning off transmission gates 126 and 128. Although transmission gates 126, 128 and 146 are shown functionally as blocks, they are field effect transistors in the preferred embodiment of the present invention. In the signal acquisition mode, transmission gates 126 and 128 turn on providing a wide loop bandwidth when the bandwidth control signal has a binary zero state. When turned on, transmission gate 126 substantially shorts out resistor 124. When transmission gate 128 is turned on, current limiter 114 is coupled to capacitor 136 by resistor 130. The value of resistor 130 is preferably chosen to be much smaller than the value of resistors 124 and 134. As a result, in the acquisition mode, the amount of current coupled to capacitor 136 during each error pulse from phase detector 110 is increased. Therefore, the magnitude of the control voltage signal can be changed more quickly, and in turn the frequency of VCO 112 is correspondingly changed more quickly in the acquisition mode. For example, current pulses of as much as two milliamps may be generated for charging and/or discharging capacitor 136 when transmission gates 126 and 128 are turned on. The maximum amount of current is limited only by the current output capacity of phase detector 110, and is held constant over varying steering line voltages by current limiter 114.

In the tracking mode, transmission gates 126 and 120 turn off providing a narrow loop bandwidth when the bandwidth control signal has a binary one state. When transmission gates 126 and 128 are turned off, capacitor 136 is charged by much smaller current pulses by means of resistors 124 and 134. For example, when the desired frequency of the output signal from VCO 112 is reached, the bandwidth control signal may be switched from the binary zero state to the binary one state by other circuitry, such as a loop-lock detector (not shown). When the loop is locked, the steering line voltage stored on capacitor 136 and the frequency of VCO 112 is changed in much smaller increments via resistors 124 and 134. For example, the current pulses coupled through resistors 124 and 134 to capacitor 136 may be on the order of fifty microamps or less when the loop is locked.

Resistor 130 and resistors 124 and 134 essentially provide constant charging and discharging currents to capacitor 136 in response to each low or high pulse, respectively, of the error signal output of phase detector 110. The magnitude of the charging/discharging current is limited by, but not directly determined by, current limiter 114. The current from current limiter 114 is divided by resistor 132 and either resistor 124 or 130 depending upon whether the acquisition or tracking mode is active. In the tracking mode, most of the current goes through resistor 132 since resistor 124 is greater in value than resistor 132, and produces a voltage drop across resistor 132 which is independent of the steering line voltage. In this case, the charrging/discharging current into capacitor 136 is determined by resistors 124 and 132 and the voltage drop across resistor 132. This configuration allows resistor 124 to be very large in value, without creating unnecessary reference feedthru. In the acquisition mode, most of the current goes through resistor 130 since resistor 130 is smaller than resistor 132. The voltage drop produced across resistors 132 and 130 is also independent of the steering line voltage. The charging/discharging current into capacitor 136 is now determined by the resistance of, and voltage drop across, resistor 130.

In the signal tracking mode, the magnitude of the current pulses applied to capacitor 136 is primarily determined by resistor 124, assuming resistor 124 is much greater than resistor 134. In this mode, the natural frequency $W_n$ and dampening factor D for the loop can be expressed as follows:

$$W_n = G/C136;$$

and $$D = (W_n \text{ R134 C136})/2;$$

where G is the open-loop gain, R134 is resistor 134, and C136 is capacitor 136. The open-loop gain G is a function of resistors 120, 132, 124 and 134. In the signal acquisition mode, the magnitude of the current pulses applied to capacitor 136 is primarily determined by resistor 130, assuming resistor 134 is much greater than resistor 130. In this mode, the natural frequency $W_n$ and dampening factor D for the loop can be expressed as follows:

$$W_n = G/C136;$$

and $$D = (W_n \text{ R130 C136})/2;$$

where R130 is resistor 130, and C136 is capacitor 136. The open-loop gain G is now a function of resistors 120, 132 and 130.

In order to be able to modulate the synthesizer with signals having frequencies as low as 200 Hz, it is necessary that the natural frequency $W_n$ be rather small. The natural frequency $W_n$ is made small by making the current pulses from phase detector 110 small. Therefore, in the tracking mode, the current pulses from phase detector 110 are made small (e.g. fifty microamps) by making resistor 124 large. Resistor 124 can be made very large in value, since most of the current from each phase detector pulse goes through resistor 132.

Referring to reference filter 140, reference signal feedthru is further attenuated by a two-section filter, the first section of which is comprised of resistor 142 and capacitor 144 and the second section of which is comprised of resistor 148 and capacitor 154. Another feature of the present invention is that the phase shift produced by reference filter 140 is changed when switching bandwidths in response to the bandwidth control signal. Transmission gate 146 is turned on in response to a binary one state of the bandwidth control signal in the signal tracking mode, and is turned off in response to a binary zero state of the bandwidth control signal to provide less phase shift at low signal frequencies so that the loop will remain stable in the acquisition mode. For example, the phase shift may be reduced from forty-nine degrees for signals having a frequency of 600 Hz when transmission gate 146 is on and maximum reference signal attenuation is desired in the tracking mode, to a phase shift of twenty-eight degrees for signals having a frequency of 600 Hz when transmission gate 146 is off and loop stability is desired in the acquisition mode.

In addition, according to another feature of the present invention, transmission gate 146 is coupled in parallel across resistor 152 to provide transient free switching. That is, resistor 152 is coupled between capacitors 154 and 144 and signal ground for establishing a voltage substantially equal to signal ground at the terminals of capacitors 154 and 144 that are coupled to transmission gate 146. Therefore, when transmission gate 146 turns on to switch to the tracking mode, no transients are generated since capacitors 154 and 144 have reached signal ground during the acquisition mode. In contrast, resistors 148 and 142 are shorted out during the acquisition mode in some prior art synthesizers. Thus, when switching to the tracking mode, such prior art synthesizers generate a voltage transient on the steering line voltage. Switching between the acquisition mode and tracking mode is transient free in reference filter 140 since the voltages across resistors 148 and 142 developed due to leakage currents in the steering input of VCO 112 will reach quiescent value during the acquisition mode and remain the same when switching to the tracking mode.

In summary, an improved adaptive loop filter for frequency synthesizers has been described that is modulatable over a wide range of audio signal frequencies, while at the same time obtaining lock quickly when the synthesizer frequency is changed. The unqiue adaptive loop filter also provides enhanced noise rejection characteristics, so that reference signal feedthru and switching transients are greatly attentuated. The adaptive loop filter of the present invention provides a wide loop bandwidth for signal acquisition and a narrow loop bandwidth for signal tracking once frequency lock has been obtained. The unique adaptive loop filer can be used in any suitable frequency synthesizer, such as those typically employed in the transmitter and receiver portions of radio transceivers.

I claim:

1. A loop filter for frequency synthesizing means, said frequency synthesizing means including a signal source for generating a reference signal, phase detecting means coupled to the reference signal and to a first feedback signal for generating an error signal, voltage-controlled oscillating (VCO) means coupled to the loop filter, and dividing means coupled to the VCO means for providing the first feedback signal, said loop filter comprising:

current limiting means coupled to the error signal from the phase detecting means for generating a current-limited output signal;

first resistive means coupled to receive the current limiting means output signal;

filtering means coupled to receive the output of the first resistive means and including a series-coupled second resistive means and capacitive means, for filtering the current limiting means output signal to provide a steering signal, the steering signal being coupled to the VCO means;

amplifying means coupled to receive the output of the capacitive means for generating a second feedback signal; and third resistive means coupling the second feedback signal to the current limiting means output signal for substantially reducing the duration of transients of the current limiting means output signal.

2. The loop filter according to claim 1, further including second filtering means intercoupled between the first filtering means and the VCO means for filtering the steering signal.

3. The loop filter according to claim 1, wherein the capacitive means of the filtering means is coupled to signal ground and the second resistive means is coupled between the steering signal and the capacitive means, said loop filter further including fourth resistive means and first and second switching means, the first switching means being coupled in parallel with the first resistive means, and the second switching means and fourth resistive means being coupled in series between the current limiting means and the capacitive means, said first and second switching means switching on in response to a first state of a bandwidth control signal and switching off in response to a second state of the bandwidth control signal for changing the bandwidth of said loop filter.

4. The loop filter according to claim 3, further including second filtering means intercoupled between the first filtering means and the VCO means for filtering the steering signal.

5. The loop filter according to claim 4, wherein said second filtering means produces a switchable phase shift and includes third switching means, said third switching means switching off in response to the first state of the bandwidth control signal and switching on in response to the second state of the bandwidth control signal for changing the phase shift provided by said second filtering means.

6. The loop filter according to claim 4, wherein said second filtering means includes third switching means and first and second phase shifting means, said first phase shifting means including a fifth resistive means and a second capacitive means, and said second phase shifting means including a sixth resistive means and a third capacitive means, said fifth and sixth resistive means coupled in series between the steering signal and the VCO means, said second capacitive means being coupled between a seventh resistive means and intercoupled fifth and sixth resistive means, the seventh resistive means further being coupled to signal ground, the third capacitive means being coupled between the VCO means and the seventh resistive means, and the third switching means being coupled in parallel with the seventh resistive means, said third switching means switching off in response to the first state of the bandwidth control signal and switching on in response to the second state of the bandwidth control signal for changing the phase shift provided by said first and second phase shifting means.

7. The loop filter according to claim 2, wherein said second filtering means comprises first and second phase shifting means coupled in series between the first filtering means and the VCO means for filtering and phase shifting the steering signal.

8. The loop filter according to claim 1, wherein said current limiting eans includes first and second transistor means coupled between the error signal and signal ground and the error signal and a voltage source, respectively.

9. A loop filter for frequency synthesizing means, said frequency synthesizing means including a signal source for generating a reference signal, phase detecting means coupled to the reference signal and to a first feedback signal for generating an error signal, voltage-controlled oscillating (VCO) means coupled to the loop filter, and dividing means coupled to the VCO means for providing the first feedback signal, said loop filter comprising:

current limiting means coupled to the error signal from the phase detecting means for generating a current-limited output signal;

filtering means coupled to receive the current limiting means output signal and including a series-coupled first resistive means and capacitive means, for filtering the current limiting means output signal to provide a steering signal, the steering signal being coupled to the VCO means;

amplifying means coupled to receive the output of the capacitive means for generating a second feedback signal; and second resistive means coupling the second feedback signal to the current limiting means output signal for substantially reducing the duration of transients on the current limiting means output signal.

10. The loop filter according to claim 9, further including second filtering means intercoupled between the first filtering means and the VCO means for filtering the steering signal.

11. The loop filter according to claim 10, wherein said second filtering means comprises first and second phase shifting means coupled in series between the first filtering means and the VCO means for filtering and phase shifting the steering signal.

12. The loop filter according to claim 9, wherein said current limiting means includes first and second transistor means coupled between the error signal and signal ground and the error signal and a voltage source, respectively.

* * * * *